(12) United States Patent
Shimizu et al.

(10) Patent No.: US 12,721,065 B2
(45) Date of Patent: Aug. 25, 2026

(54) METHOD OF PROCESSING SUBSTRATE, METHOD OF MANUFACTURING SEMICONDUCTOR DEVICE, SUBSTRATE PROCESSING APPARATUS, AND RECORDING MEDIUM

(71) Applicant: Kokusai Electric Corporation, Tokyo (JP)

(72) Inventors: Tomiyuki Shimizu, Toyama (JP); Takashi Ozaki, Toyama (JP); Naonori Akae, Toyama (JP); Keigo Nishida, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 409 days.

(21) Appl. No.: 18/354,238

(22) Filed: Jul. 18, 2023

(65) Prior Publication Data

US 2023/0360904 A1 Nov. 9, 2023

Related U.S. Application Data

(63) Continuation of application No. PCT/JP2021/007506, filed on Feb. 26, 2021.

(51) Int. Cl.
*H01L 21/02* (2006.01)
*C23C 16/455* (2006.01)
(Continued)

(52) U.S. Cl.
CPC .... *H10P 14/6927* (2026.01); *C23C 16/45544* (2013.01); *H10P 14/6304* (2026.01);
(Continued)

(58) Field of Classification Search
None
See application file for complete search history.

(56) References Cited

U.S. PATENT DOCUMENTS 10,421,766 B2 9/2019 Spence et al.
2005/0250348 A1* 11/2005 Xia .................. H01L 21/02362 438/789
(Continued)

FOREIGN PATENT DOCUMENTS

CN 107068536 A 8/2017
JP 2011-061218 A 3/2011
(Continued)

OTHER PUBLICATIONS

Extended European Search Report issued on Dec. 17, 2024 for European Patent Application No. 21927925.4.
(Continued)

*Primary Examiner* — Asok K Sarkar
(74) *Attorney, Agent, or Firm* — Volpe Koenig

(57) ABSTRACT

There is provided a technique that includes forming a film containing a predetermined element, oxygen, and nitrogen on the substrate by performing a cycle a predetermined number of times, the cycle including: (a) supplying a first precursor containing the predetermined element to the substrate; (b) supplying a second precursor having a molecular structure different from a molecular structure of the first precursor and containing the predetermined element and oxygen; (c) supplying an oxidizing agent to the substrate; and (d) supplying a nitriding agent to the substrate.

18 Claims, 7 Drawing Sheets

(51) Int. Cl.
*H10P 14/60* (2026.01)
*H10P 14/692* (2026.01)

(52) U.S. Cl.
CPC ...... *H10P 14/6316* (2026.01); *H10P 14/6339* (2026.01); *H10P 14/6682* (2026.01)

(56) References Cited

U.S. PATENT DOCUMENTS

2009/0170345 A1 7/2009 Akae et al.
2012/0119337 A1 5/2012 Sasaki et al.
2013/0196082 A1 8/2013 Spence et al.
2016/0090649 A1 3/2016 Varadarajan
2016/0365246 A1 12/2016 Yamamoto et al.
2017/0117140 A1 4/2017 Tak et al.
2017/0140925 A1* 5/2017 Suzuki ................ H01L 21/0337
2017/0271143 A1 9/2017 Fukiage et al.
2017/0323782 A1* 11/2017 Suzuki ................ C23C 16/4408
2018/0240665 A1 8/2018 Sano et al.
2020/0294798 A1 9/2020 Wagatsuma et al.
2020/0395211 A1* 12/2020 Jia ..................... C23C 16/45536

FOREIGN PATENT DOCUMENTS

JP 2012-104720 A 5/2012
JP 2013-155173 A 8/2013
JP 2017-005095 A 1/2017
JP 2018-137356 A 8/2018
TW 1602827 A 10/2017

OTHER PUBLICATIONS

Taiwan Office Action, Taiwan Application No. 110147623, Jul. 6, 2022, 23 pgs.
International Search Report, PCT/JP2021/007506, May 25, 2021, 5 pgs.

* cited by examiner

| Sample | 1 | 2 | 3 |
|---|---|---|---|
| Thick. (Å) | 106.7 | 98.6 | 106.7 |
| R. I. | 1.539 | 1.558 | 1.607 |
| N concentration (%) | 9.5 | 11.6 | 18.1 |

METHOD OF PROCESSING SUBSTRATE, METHOD OF MANUFACTURING SEMICONDUCTOR DEVICE, SUBSTRATE PROCESSING APPARATUS, AND RECORDING MEDIUM

CROSS-REFERENCE TO RELATED APPLICATIONS

This application is a Bypass Continuation application of PCT International Application No. PCT/JP2021/007506, filed on Feb. 26, 2021, the entire contents of which are incorporated herein by reference.

TECHNICAL FIELD

The present disclosure relates to a method of processing a substrate, a method of manufacturing semiconductor devices, a substrate processing apparatus, and a recording medium.

BACKGROUND

In a process of manufacturing a semiconductor device, there is a substrate processing process in which a precursor, an oxidizing agent, and a nitriding agent are supplied to a substrate to form a film containing a predetermined element, oxygen, and nitrogen on the substrate.

SUMMARY

The present disclosure is to enhance controllability of a composition ratio of a film containing a predetermined element, oxygen, and nitrogen, which is formed on a substrate.

According to one embodiment of the present disclosure, there is provided a technique that includes forming a film containing a predetermined element, oxygen, and nitrogen on the substrate by performing a cycle a predetermined number of times, the cycle including: (a) supplying a first precursor containing the predetermined element to the substrate; (b) supplying a second precursor having a molecular structure different from a molecular structure of the first precursor and containing the predetermined element and oxygen; (c) supplying an oxidizing agent to the substrate; and (d) supplying a nitriding agent to the substrate.

BRIEF DESCRIPTION OF DRAWINGS

The accompanying drawings, which are incorporated in and constitute a part of the specification, illustrate embodiments of the present disclosure.

FIG. 6 is a diagram illustrating various measured results of a film formed on the substrate.

DETAILED DESCRIPTION

Figure 1:
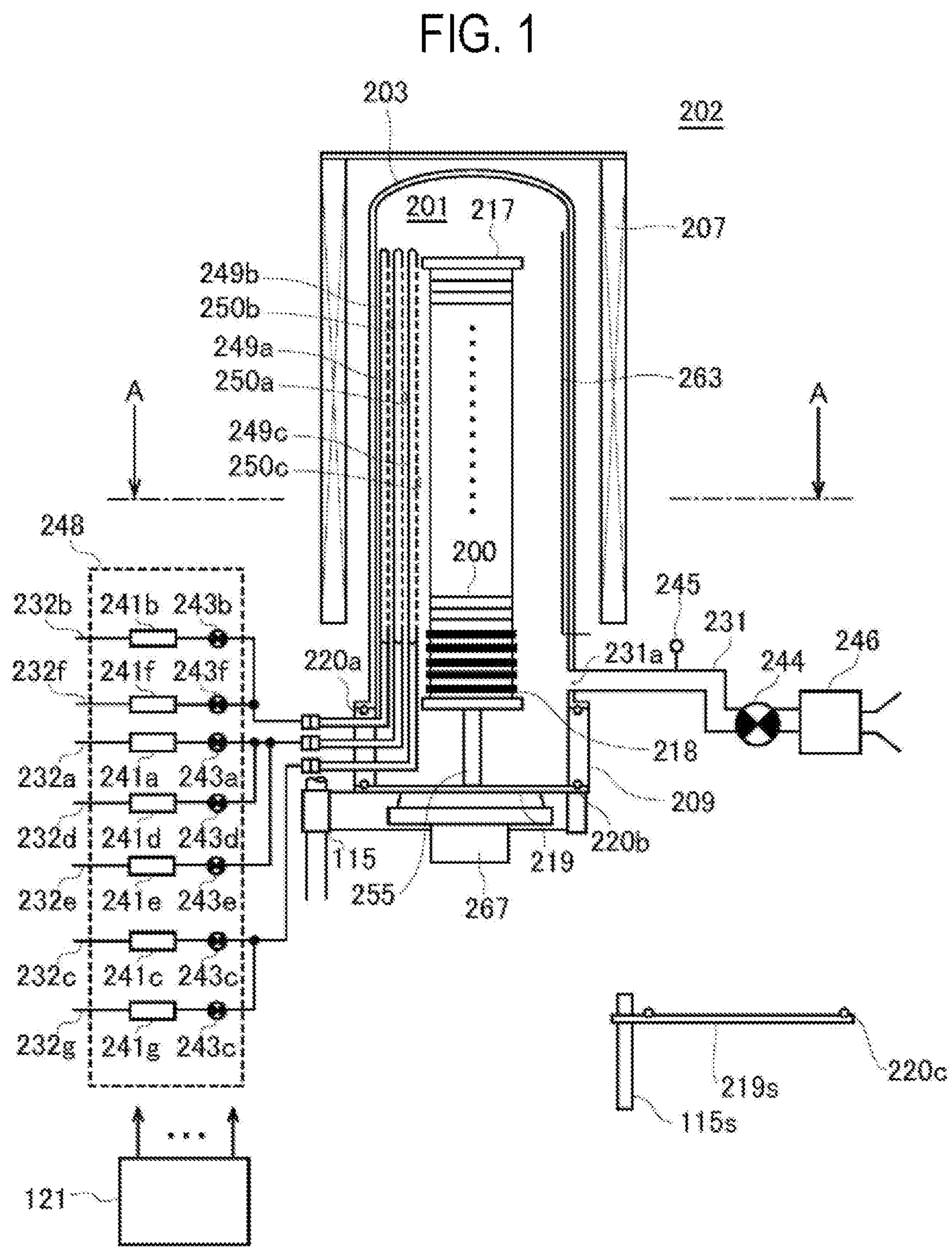
FIG. 1 is a longitudinal sectional view illustrating a schematic configuration of a substrate processing apparatus, specifically, a vertical process furnace 202, suitably used in an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiment of Present Disclosure

Hereinafter, an embodiment of the present disclosure will be described with reference mainly to FIGS. 1 to 4 and FIGS. 5A to 5E. In addition, the drawings used in the following description are all schematic and the dimensional relationships and proportions of each element on the drawing may not necessarily correspond to those in reality. Further, the dimensional relationships and proportions of each element may not necessarily correspond between multiple drawings.

(1) Configuration of Substrate Processing Apparatus

As illustrated in FIG. 1, a process furnace 202 includes a heater 207 as a temperature adjuster (heating part). The heater 207 has a cylindrical shape and is mounted vertically by being supported by a holding plate. The heater 207 also functions as an activator (exciter) that activates (excites) a gas with heat.

A reaction tube 203 is arranged inside the heater 207 to be concentric with the heater 207. The reaction tube 203 is made of, for example, a heat-resistant material such as quartz ($SiO_2$) or a silicon carbide (SiC), and has a cylindrical shape with its upper end closed and its lower end opened. A manifold 209 is arranged to be concentric with the reaction tube 203 below the reaction tube 203. The manifold 209 is made of, for example, a metal material such as stainless steel (SUS), and has a cylindrical shape with both of its upper and lower ends opened. The upper end of the manifold 209 is engaged with the lower end of the reaction tube 203 so as to support the reaction tube 203. An O-ring **220*a* as a sealing member is installed between the manifold 209 and the reaction tube 203. The reaction tube 203 is installed vertically, similarly to the heater 207. A process container (reaction container) is mainly constituted by the reaction tube 203 and the manifold 209. A process chamber 201 is formed in a hollow cylindrical portion of the process container. The process chamber 201 is configured to be capable of accommodating a wafer 200 as a substrate. Processing on the wafer 200 is performed in the process chamber 201**.

Nozzles 249*a* to 249*c*, which serve as first to third suppliers, are installed in the process chamber 201 so as to penetrate a sidewall of the manifold 209, respectively. The nozzles 249*a* to 249*c* are also referred to as first to third nozzles, respectively. The nozzles 249*a* to 249*c* are made of, for example, a heat-resistant material such as quartz or SiC. Gas supply pipes 232*a* to 232*c* are respectively connected to the nozzles 249*a* to 249*c*. The nozzles 249*a* to 249*c* are different nozzles, and each of the nozzles 249*b* and 249*c* is installed adjacent to the nozzle 249*a*.

Mass flow controllers (MFCs) 241*a* to 241*c*, which are flow rate controllers (flow rate control parts), and valves 243*a* to 243*c*, which are opening/closing valves, are installed in the gas supply pipes 232*a* to 232*c*, respectively, sequentially from the upstream side of gas flow. Gas supply pipes 232*d* and 232*e* are connected to the gas supply pipe 232*a* at the downstream side of from the valve 243*a*. Gas supply pipes 232*f* and 232*g* are connected to the gas supply pipes 232*b* and 232*c* at the downstream side of the valves 243*b* and 243*c*, respectively. MFCs 241*e* to 241*g* and valves 243*e* to 243*g* are installed in the gas supply pipes 232*e* to 232*g*, respectively, sequentially from the upstream side of gas flow. The gas supply pipes 232*a* to 232*g* are made of, for example, a metal material such as SUS.

Figure 2:
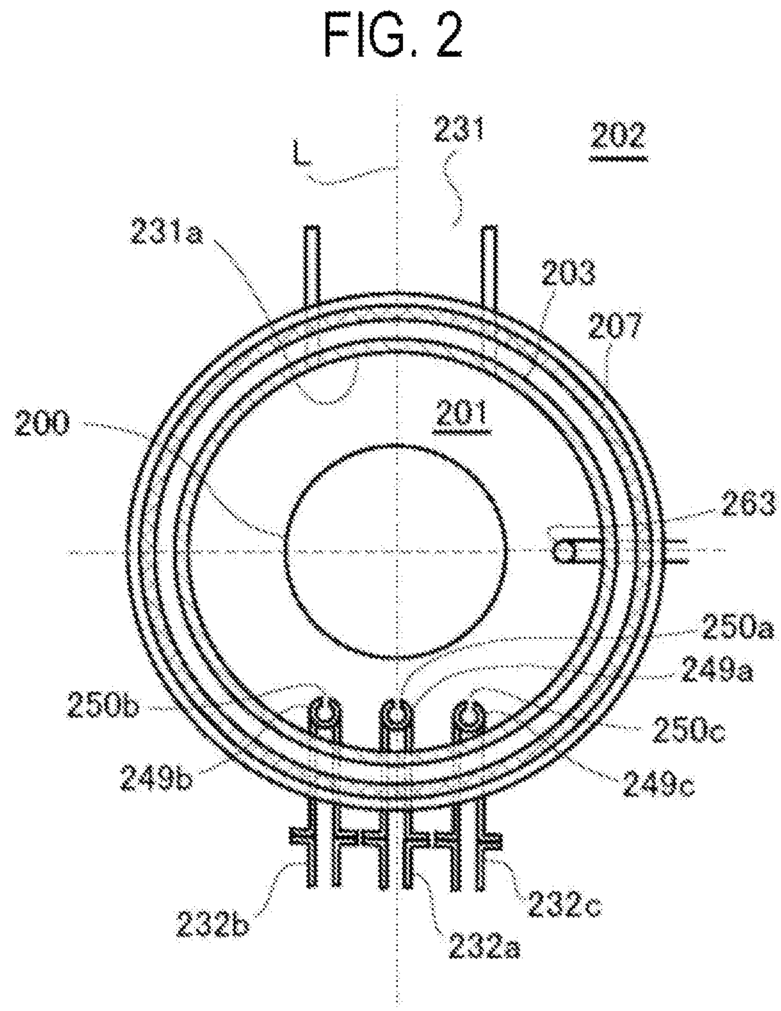
FIG. 2 is a cross-sectional view taken along line A-A of FIG. 1 illustrating a schematic configuration of the substrate processing apparatus, specifically, the vertical process furnace 202, suitably used in an embodiment of the present disclosure.

As illustrated in FIG. 2, the nozzles 249*a* to 249*c* are provided in an annular space in a plan view between an inner wall of the reaction tube 203 and the wafer 200 so as to extend upward in the arrangement direction of the wafer 200 from a lower portion of the inner wall of the reaction tube 203 and to an upper portion thereof. That is, the nozzles 249*a* to 249*c* are installed in area region horizontally surrounding a wafer arrangement region in which the wafers 200 are arranged at a lateral side of the wafer arrangement region, along the wafer arrangement region. In a plan view, the nozzle 249*a* is arranged so as to face an exhaust port 231*a*, which will be described later, in a straight line with the center of the wafer 200 loaded into the process chamber 201, which is interposed therebetween. The nozzles 249*b* and 249*c* are arranged so as to sandwich a straight line L, which passes through the centers of the nozzle 249*a* and the exhaust port 231*a* from both sides along the inner wall of the reaction tube 203 (the outer periphery of the wafer 200). The straight line L is also a straight line passing through the centers of the nozzle 249*a* and the wafer 200. That is, it can also be said that the nozzle 249*c* is installed on the opposite side of the nozzle 249*b* with the straight line L interposed therebetween. The nozzles 249*b* and 249*c* are arranged in line symmetry with the straight line L as the axis of symmetry. Gas supply holes 250*a* to 250*c* for supplying gases are respectively formed on the side surfaces of the nozzles 249*a* to 249*c*. The gas supply holes 250*a* to 250*c* are opened so as to oppose (face) the exhaust port 231*a* in a plan view, which enables a gas to be supplied toward the wafer 200. A plurality of gas supply holes 250*a* to 250*c* are formed from the lower portion of the reaction tube 203 to the upper portion thereof.

A first precursor (first precursor gas), which contains a predetermined element, is supplied from the gas supply pipe 232*a* into the process chamber 201 via the MFC 241*a*, the valve 243*a*, and the nozzle 249*a*.

An oxidizing agent (oxidizing gas) is supplied from the gas supply pipe 232*b* into the process chamber 201 via the MFC 241*b*, the valve 243*b*, and the nozzle 249*b*.

A nitriding agent (nitriding gas) is supplied from the gas supply pipe 232*c* into the process chamber 201 via the MFC 241*b*, the valve 243*b*, and the nozzle 249*b*.

A second precursor (second precursor gas), which has a molecular structure different from that of the aforementioned first precursor and contains the predetermined element and oxygen (O), is supplied from the gas supply pipe 232*d* into the process chamber 201 via the MFC 241*d*, the valve 243*d*, the gas supply pipe 232*a*, and the nozzle 249*a*.

An inert gas is supplied from the gas supply pipes 232*e*, 232*f* and 232*g* into the process chamber 201 via the MFCs 241*e*, 241*f* and 241*g*, the valves 243*e*, 243*f* and 243*g*, the gas supply pipes 232*a*, 232*b* and 232*c*, and the nozzles 249*a*, 249*b* and 249*c*. The inert gas acts as a purge gas, a carrier gas, and a dilution gas, for example.

A first precursor supply system mainly includes the gas supply pipe 232*a*, the MFC 241*a*, and the valve 243*a*. An oxidizing agent supply system mainly includes the gas supply pipe 232*b*, the MFC 241*b*, and the valve 243*b*. A nitriding agent supply system mainly includes the gas supply pipe 232*c*, the MFC 241*c*, and the valve 243*c*. A second precursor supply system mainly includes the gas supply pipe 232*d*, the MFC 241*d*, and the valve 243*d*. An inert gas supply system mainly includes the gas supply pipes 232*e* to 232*g*, the MFCs 241*e* to 241*g*, and the valves 243*e* to 243*g*.

In addition, at least one selected from the group of the first precursor gas, the second precursor gas, the oxidizing gas, and the nitriding gas is also referred to as a film-forming gas, and at least one selected from the group of the first precursor supply system, the second precursor supply system, the oxidizing agent supply system, and the nitriding agent supply system is also referred to as a film-forming gas supply system.

One or all of the gas supply systems described above may be configured as an integrated-type gas supply system 248 in which components such as the valves 243*a* to 243*g* and the MFCs 241*a* to 241*g* are integrated. The integrated-type gas supply system 248 is connected to each of the gas supply pipes 232*a* to 232*g*, and is configured such that operations of supplying various gases into the gas supply pipes 232*a* to 232*g* such as an opening/closing operation of the valves 243*a* to 243*g*, a flow rate adjustment operation by the MFCs 241*a* to 241*g*, and the like, are controlled by a controller 121 to be described later. The integrated-type gas supply system 248 is configured as an integral type or detachable-type integrated unit, and may be configured to be capable of being attached or detached from desired targets such as the gas supply pipes 232*a* to 232*g* and the like on an integrated unit basis, so that the maintenance, replacement, expansion, etc. of the integrated-type gas supply system 248 can be performed on an integrated unit basis.

The exhaust port 231*a* for exhausting an internal atmosphere of the process chamber 201 is installed below the sidewall of the reaction tube 203. As illustrated in FIG. 2, the exhaust port 231*a* is installed at a position opposing (facing) the nozzles 249*a* to 249*c* (gas supply holes 250*a* to 250*c*) with the wafer 200 interposed therebetween in a plan view. The exhaust port 231*a* may be installed from a lower portion of the sidewall of the reaction tube 203 to an upper portion thereof, that is, along the wafer arrangement region. An exhaust pipe 231 is connected to the exhaust port 231*a*. The exhaust pipe 231 is made of, for example, a metal material such as SUS. The exhaust pipe 231 is connected to a vacuum pump 246 as a vacuum exhauster via a pressure sensor 245 as a pressure detector (pressure detecting part) that detects the internal pressure of the process chamber 201 and an auto pressure controller (APC) valve 244 as a pressure adjuster (pressure adjusting part). The APC valve 244 is configured to be capable of performing or stopping a vacuum exhausting operation in the process chamber 201 by opening or closing the valve while the vacuum pump 246 is in operation, and is also configured to adjust the internal pressure of the process chamber 201 by regulating an opening degree of the valve based on pressure information detected by the pressure sensor 245 while the vacuum pump 246 is in operation. An exhaust system mainly includes the exhaust pipe 231, the APC valve 244, and the pressure sensor 245. The vacuum pump 246 may be considered to be incorporated in the exhaust system.

A seal cap 219, which serves as a furnace opening cover configured to hermetically seal a lower end opening of the manifold 209, is installed under the manifold 209. The seal cap 219 is made of, for example, a metal material such as SUS, and is formed in a disc shape. An O-ring 220*b*, which is a seal member making contact with the lower end of the manifold 209, is installed on an upper surface of the seal cap 219. A rotator 267 configured to rotate a boat 217, which will be described later, is installed under the seal cap 219. A rotating shaft 255 of the rotator 267 is made of, for example, a metal material such as SUS, and is connected to the boat 217 through the seal cap 219. The rotator 267 is configured to rotate the wafer 200 by rotating the boat 217. The seal cap 219 is configured to be moved up and down in the vertical direction by a boat elevator 115 as an elevating mechanism installed outside the reaction tube 203. The boat elevator 115 is configured as a transfer device (transfer mechanism) which loads and unloads (transfers) the wafer 200 into and out of the process chamber 201 by moving the seal cap 219 up and down.

A shutter 219*s*, which serves as a furnace opening cover configured to hermetically seal a lower end opening of the manifold 209 in a state where the seal cap 219 is lowered and the boat 217 is unloaded from the process chamber 201, is installed under the manifold 209. The shutter 219*s* is made of, for example, a metal material such as SUS and is formed in a disc shape. An O-ring 220*c*, which is a seal member making contact with the lower end of the manifold 209, is installed on an upper surface of the shutter 219*s*. An opening/closing operation of the shutter 219*s* (such as an elevating operation, rotation operation, or the like) is controlled by a shutter opener/closer 115*s*.

The boat 217 serving as a substrate supporter is configured to support a plurality of (e.g., 25 to 200) wafers 200, in such a state that the wafers are arranged in a horizontal posture and in multiple stages along a vertical direction with the centers of the wafers 200 aligned with one another. As such, the boat 217 is configured to arrange the wafers 200 to be spaced apart from each other. The boat 217 is made of, for example, a heat-resistant material such as quartz or SiC. Heat insulating plates 218, which are made of, for example, a heat-resistant material such as quartz or SiC, are supported in multiple stages in a lower region of the boat 217.

A temperature sensor 263 serving as a temperature detector is installed in the reaction tube 203. A degree of supplying electric power to the heater 207 is adjusted based on temperature information detected by the temperature sensor 263, so that an internal temperature of the process chamber 201 has a desired temperature distribution. The temperature sensor 263 is installed along the inner wall of the reaction tube 203.

Figure 3:
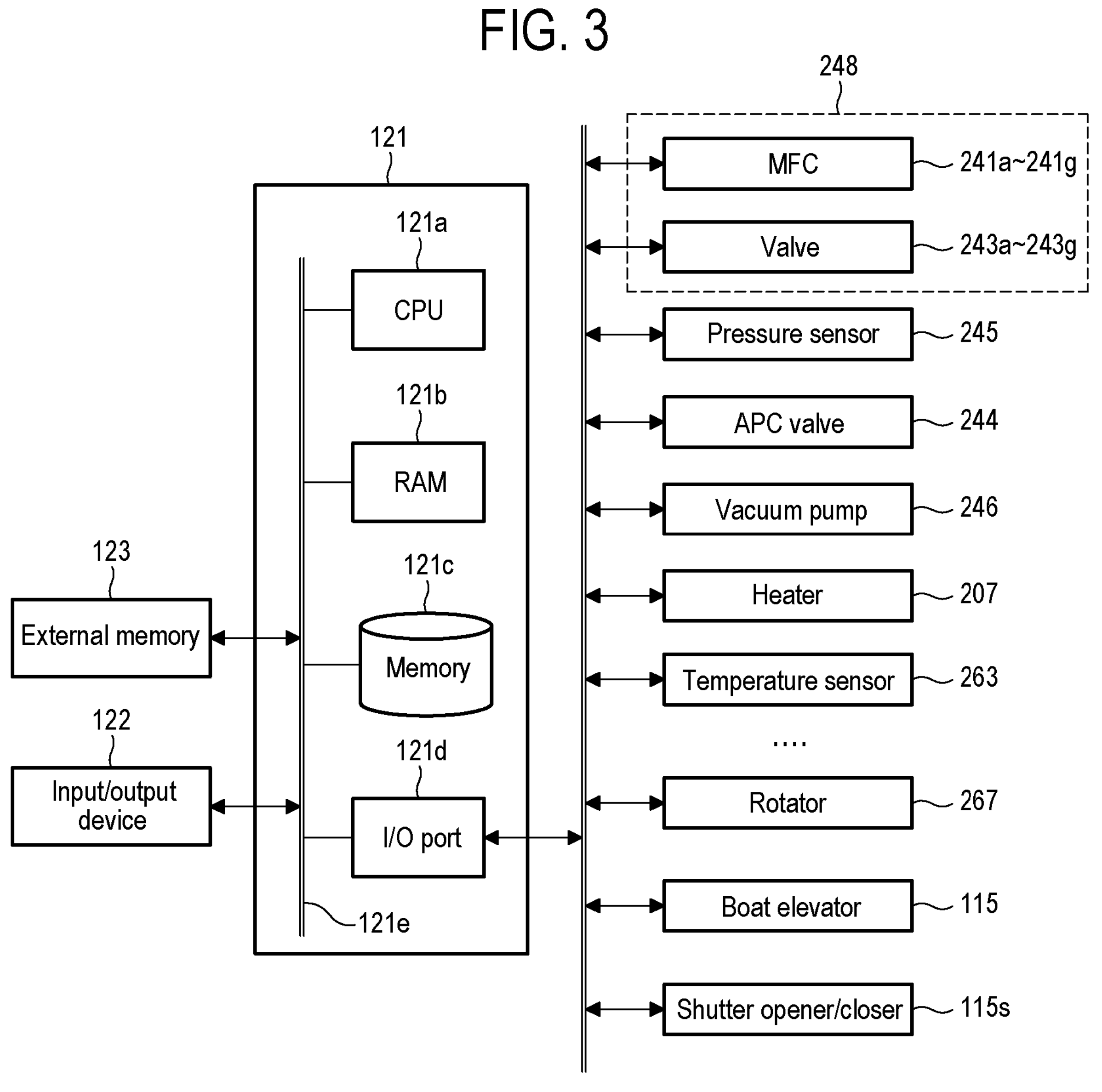
FIG. 3 is a block diagram illustrating a schematic configuration of a controller 121, specifically, a control system of the controller 121, in the substrate processing apparatus suitably used in an embodiment of the present disclosure.

As illustrated in FIG. 3, the controller 121, which is a control part (control device), is configured as a computer including a central processing unit (CPU) 121*a*, a random access memory (RAM) 121*b*, a memory 121*c*, and an I/O port 121*d*. The RAM 121*b*, the memory 121*c*, and the I/O port 121*d* are configured to be capable of exchanging data with the CPU 121*a* via an internal bus 121*e*. An input/output device 122, which is configured as, for example, a touch panel, is connected to the controller 121.

The memory 121*c* is constituted by, for example, a flash memory, a hard disk drive (HDD) and a solid state drive (SSD). A control program for controlling the operation of the substrate processing apparatus and a process recipe describing the substrate processing procedures, conditions, and other information, which will be described later, are readably stored in the memory 121*c*. The process recipe is a combination for causing the controller 121 to execute each substrate processing procedure, which will be described later, to obtain expected results, and functions as a program. Hereinafter, the process recipe, control program, and similar ones may be generally and simply referred to as a "program." Further, the process recipe is simply referred to as a recipe. When the term "program" is used herein, it may refer to the recipe alone, the control program alone, or both of them. The RAM 121*b* is configured as a memory area (work area) in which programs, data, and other information read by the CPU 121*a* are temporarily stored.

The I/O port 121*d* is connected to, e.g., the above-described MFCs 241*a* to 241*g*, valves 243*a* to 243*g*, pressure sensor 245, APC valve 244, vacuum pump 246, temperature sensor 263, heater 207, rotator 267, boat elevator 115, and shutter opener/closer 115*s*.

The CPU 121*a* is configured to be capable of reading and executing the control program from the memory 121*c* and to be capable of reading the recipe from the memory 121*c*, for example, according to an input of an operation command from the input/output device 122. The CPU 121*a* is configured to be capable of controlling, e.g., a flow rate adjustment operation of various gases by the MFCs 241*a* to 241*g*, an opening/closing operation of the valves 243*a* to 243*g*, an opening/closing operation of the APC valve 244, a pressure adjustment operation by the APC valve 244 based on the pressure sensor 245, the actuating and stopping operation of the vacuum pump 246, a temperature adjustment operation of the heater 207 based on the temperature sensor 263, the operation of rotating the boat 217 with the rotator 267 and adjusting the rotation speed of the boat 217, an elevating operation of the boat 217 by the boat elevator 115, and an opening/closing operation of the shutter 219*s* by the shutter opener/closer 115*s*, and so on, according to contents of the read recipe.

The controller 121 may be configured by installing, on the computer, the above-described program stored in an external memory 123. The external memory 123 includes, for example, a magnetic disk such as HDD, an optical disk such as CD, a magneto-optical disk such as MO, and a semiconductor memory such as USB memory or SSD. The memory 121*c* or the external memory 123 is configured as computer-readable recording medium. In the following, these are collectively and simply referred to as a recording medium. When the term "recording medium" is used herein, it may refer to the memory 121*c* alone, the external memory 123 alone, or both of them. In addition, the program may be provided to the computer using a telecommunication device such as the Internet or a dedicated network without using the external memory 123.

(2) Substrate Processing Process

As a process of manufacturing a semiconductor device using the substrate processing apparatus described above, a sequence example of performing processing on the wafer 200 as a substrate, for example, a film-forming sequence example of forming a film on the wafer 200 will be described mainly with reference to FIG. 4. In the following descriptions, an operation of each constituent element of the substrate processing apparatus is controlled by the controller 121.

In a film-forming sequence according to the present embodiment, a film containing a predetermined element, oxygen, and nitrogen is formed on the wafer 200 by performing a cycle a predetermined number of times (n times, where n is an integer of 1 or more), the cycle including:

Step A of supplying a first precursor containing a predetermined element to the wafer 200;

Step B of supplying a second precursor having a molecular structure different from that of the first precursor and containing the predetermined element and oxygen to the wafer 200;

Step C of supplying an oxidizing agent to the wafer 200; and

Step D of supplying a nitriding agent to the wafer 200.

Figures 4, 5A:
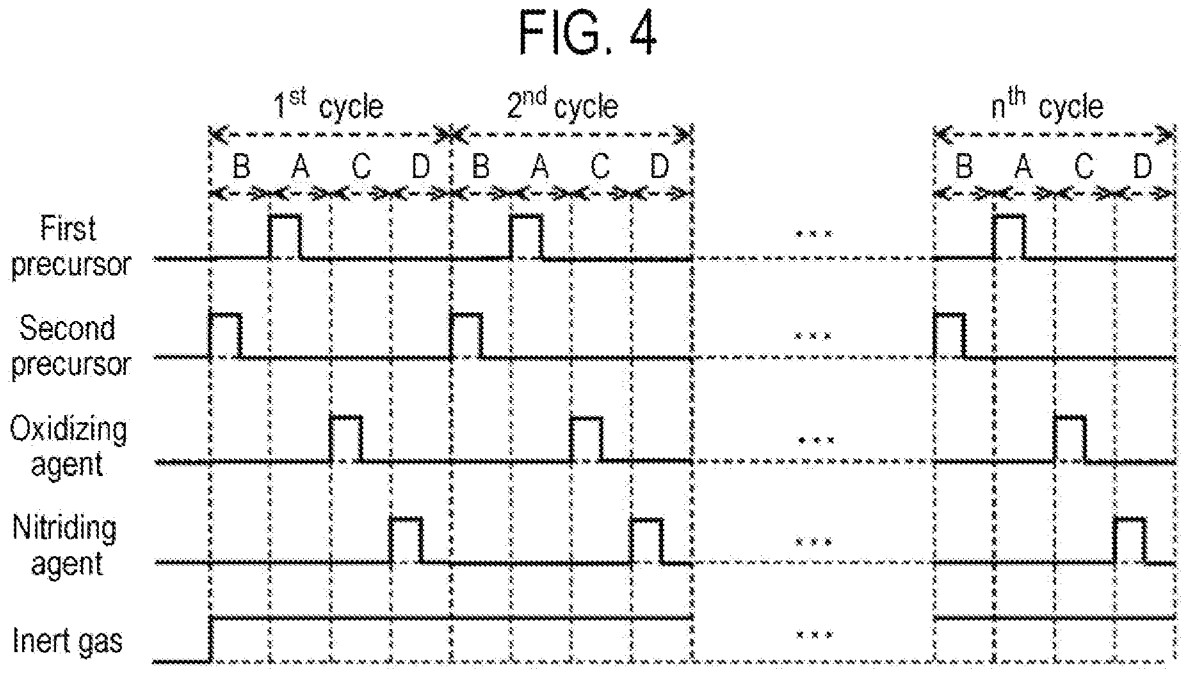
FIG. 4 is a flowchart illustrating a gas supply sequence according to an embodiment of the present disclosure.
FIG. 5A is a diagram schematically illustrating a surface state of a substrate before initiating a film-forming process.

In addition, a gas supply sequence illustrated in FIG. 4 indicates, in each cycle, a case where Steps C and D are performed after Steps A and B, specifically, a case where Steps A, B, C, and D are performed non-simultaneously, more specifically, a case where Steps B, A, C, and D are performed in this order.

Herein, the above-described film-forming sequence may be indicated as follows for convenience. The same notation is also used in the following descriptions of modifications and other embodiments.

(Second Precursor→First Precursor→Oxidizing agent→Nitriding agent)×n

When the term "wafer" is used herein, it may refer to "the wafer itself" or "a wafer and a stacked body of certain layers or films formed on a surface of the wafer." When the phrase "a surface of a wafer" is used herein, it may refer to "a surface of a wafer itself" or "a surface of a certain layer formed on the wafer". When the expression "a certain layer is formed on a wafer" is used herein, it may mean that "a certain layer is formed directly on a surface of a wafer itself" or "a certain layer is formed on a layer formed on a wafer." When the term "substrate" is used herein, it may be synonymous with the term "wafer."

(Wafer Charging and Boat Loading)

After a plurality of wafers 200 are loaded into the boat 217 (wafer charging), the shutter **219*s* is moved by the shutter opener/closer 115*s* to open the lower end opening of the manifold 209 (shutter opening). After that, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 with the O-ring 220*b*** interposed therebetween.

(Pressure Adjustment and Temperature Adjustment)

After the boat loading is completed, the interior of the process chamber 201, that is, a space where the wafers 200 are placed, is vacuum-exhausted (decompression-exhausted) by the vacuum pump 246 to reach a desired pressure (degree of vacuum). At this time, the internal pressure of the process chamber 201 is measured by the pressure sensor 245, and the APC valve 244 is feedback-controlled based on the measured pressure information (pressure adjustment). Further, the wafers 200 in the process chamber 201 are heated by the heater 207 so as to have a desired processing temperature. At this time, the degree of supplying electric power to the heater 207 is feedback-controlled based on temperature information detected by the temperature sensor 263 so that the interior of the process chamber 201 has a desired temperature distribution (temperature adjustment). Further, the rotation of the wafers 200 by the rotator 267 is started. All of the exhaust of the interior of the process chamber 201 and the heating and rotation of the wafers 200 are continuously performed at least until the processing on the wafers 200 is completed.

As illustrated in FIG. 5A, the wafer 200 has a hydroxyl group terminated (OH-terminated) surface. The OH-terminated sites on the surface of the wafer 200 function as adsorption sites of molecules or atoms.

(Film-Forming Process)

After that, the following Steps B, A, C, and D are sequentially executed.

[Step B]

In this step, a second precursor is supplied to the wafer 200 in the process chamber 201.

Specifically, the valve **243*d* is opened to allow the second precursor to flow into the gas supply pipe 232*d*. The flow rate of the second precursor is adjusted by the MFC 241*d*, and the second precursor is supplied into the process chamber 201 through the gas supply pipe 232*a* and the nozzle 249*a*, and is exhausted from the exhaust port 231*a*. At this time, the second precursor is supplied to the wafers 200 (second precursor supply). At this time, the valves 243*e* to 243*g* are opened to supply an inert gas into the process chamber 201 through the respective nozzles 249*a* to 249*c*. In addition, in some methods described below, the supply of the inert gas into the process chamber 201** may not be performed.

As the second precursor, a gas having a molecular structure containing an alkoxy group bonded to silicon (Si) as a predetermined element may be used. For example, a gas in which an amino group is bonded to one of bonding hands of Si as a predetermined element constituting a central atom X, and an alkoxy group is bonded to the remaining three bonding hands may be used as the second precursor.

The amino group is a monovalent functional group having a structure obtained by removing hydrogen (H) from any of ammonia ($NH_3$), primary amine, and secondary amine, and are represented by a structural formula of —$NH_2$, —NHR, or —NRR'. In the structural formula, R and R' represent an alkyl group including, for example, a methyl group, an ethyl group, a propyl group, a butyl group, or the like. R and R' may be not only this linear alkyl group but also a branched alkyl group such as an isopropyl group, an isobutyl group, a secondary butyl group, a tertiary butyl group, or the like. R and R' may be the same alkyl group or different alkyl groups.

The alkoxy group is a monovalent functional group having a structure obtained by bonding an alkyl group R to an oxygen (O) atom, and is represented by a structural formula of —OR. The alkoxy group includes, for example, a methoxy group, an ethoxy group, a propoxy group, a butoxy group, and the like. The alkoxy group may be not only this linear alkoxy group but also a branched alkoxy group such as an isopropoxy group, an isobutoxy group, a secondary butoxy group, a tertiary butoxy group, or the like. Further, the alkyl group includes, for example, a methyl group, an ethyl group, a propyl group, and a butyl group as described above. The alkyl group may be not only this linear alkyl group but also a branched alkyl group such as an isopropyl group, an isobutyl group, a secondary butyl group, a tertiary butyl group, or the like.

As the second precursor, for example, a dialkylaminotrialkoxysilane gas such as trimethoxydimethylaminosilane ($(CH_3)_2NSi(OCH_3)_3$, abbreviation: TMDMAS) gas, trimethoxydiethylaminosilane ($(C_2H_5)_2NSi(OCH_3)_3$) gas, triethoxydimethylaminosilane ($(CH_3)_2NSi(OC_2H_5)_3$) gas, and triethoxydiethylaminosilane ($(C_2H_5)_2NSi(OC_2H_5)_3$) gas may be used. Si contained in these gases has four bonding hands, where three of the four bonding hands of Si are bonded to the alkoxy group and the remaining one of the four bonding hands of Si is bonded to an amino group. The ratio of the number of the amino group to the number of the alkoxy group contained in a gas molecule is 1:3. The bonding energy $E_O$ between the alkoxy group and Si is higher than the bonding energy $E_A$ between the amino group and Si. That is, the amino group has an active property characteristic of being easily detached from Si as compared with the alkoxy group.

As the inert gas, for example, a rare gas such as a nitrogen ($N_2$) gas, an argon (Ar) gas, a helium (He) gas, a neon (Ne) gas, and a xenon (Xe) gas may be used. One or more of these may be used as the inert gas. This is also the same for each step to be described later.

For example, when using a TMDMAS gas as the second precursor, by performing this step under a processing condition described later, it is possible to detach a dimethylamino group (—$NMe_2$) from Si contained in the TMDMAS gas without detaching a methoxy group (—OMe). Further, Si having a state in which the dimethylamino group is detached therefrom and the methoxy group is bonded thereto can be caused to be adsorbed (chemisorbed) onto the surface of the wafer 200. That is, it is possible to adsorb Si, where an alkoxy group is bonded to three of four bonding hands of Si, onto a part of the adsorption sites on the surface of the wafer 200. In this way, a first layer containing a component in which the alkoxy group is bonded to Si can be on the outermost surface of the wafer 200. In addition, a reaction product generated when forming this layer constitutes, for example, a gaseous substance containing the amino group, and is discharged from the interior of the process chamber 201.

Further, by performing this step under a processing condition described later, it is possible to prevent the amino group, which is detached from Si contained in the second precursor, from being adsorbed onto the surface of the wafer 200. As a result, it is possible to suppress the amino group, which is detached from Si contained in the second precursor, from being contained in the first layer formed on the wafer 200.

In this step, by the methoxy group bonded to Si adsorbed onto the surface of the wafer 200, that is, by allowing three bonding hands of Si adsorbed onto the surface of the wafer 200 to be filled with the methoxy group, it is possible to inhibit the adsorption of atoms or molecules to Si adsorbed onto the surface of the wafer 200. Further, in this step, by allowing the methoxy group bonded to Si adsorbed onto the surface of the wafer 200 to act as a steric hindrance, it is possible to inhibit the adsorption of an atom or a molecule onto the adsorption site (OH termination) on the surface of the wafer 200 that is located in a vicinity of Si adsorbed onto the surface of the wafer 200. Thus, in this step, it is also possible to retain at least some of the adsorption sites (OH termination) on the surface of the wafer 200 that are located in a vicinity of Si adsorbed onto the surface of the wafer 200. In other words, it is also possible to prevent, in any other process, a reduction (consumption) of at least some of the adsorption sites (OH termination) on the surface of the wafer 200 that are located in a vicinity of Si adsorbed onto the surface of the wafer 200.

In this step, the supply of the second precursor is continued until the adsorption reaction (chemisorption reaction) of Si on the surface of the wafer 200 is saturated. Even though the supply of the second precursor is continued in this way, the methoxy group bonded to Si acts as steric hindrance, so that it is possible to allow Si to be discontinuously adsorbed onto the surface of the wafer 200. Specifically, it is possible to adsorb Si onto the surface of the wafer 200 with a thickness of less than one atomic layer.

Figure 5B:
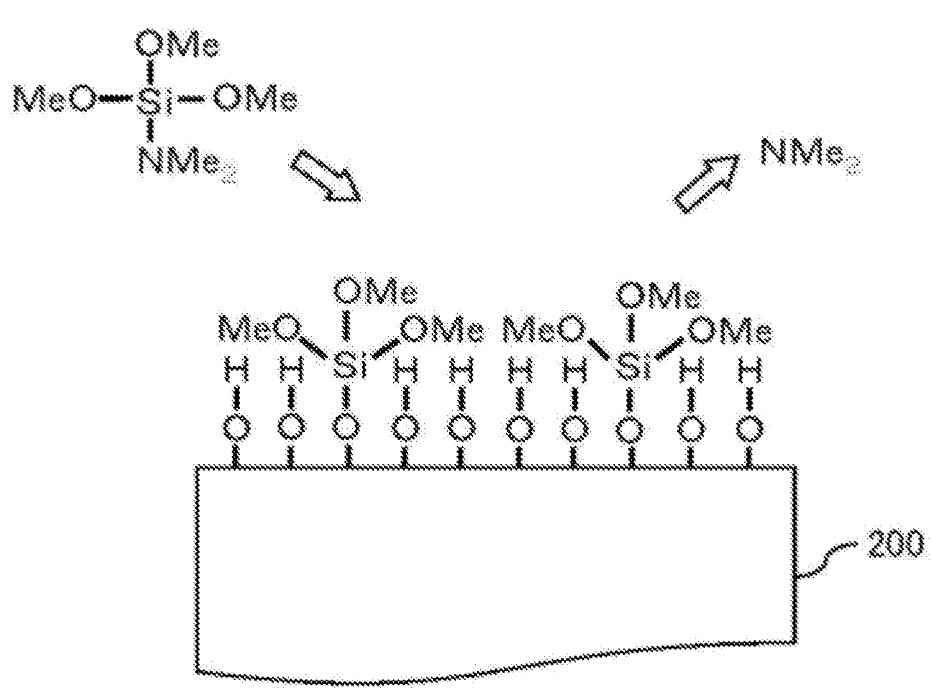
FIG. 5B is a diagram schematically illustrating a surface state of the substrate when Step B is performed.

In a state in which the adsorption reaction of Si on the surface of the wafer 200 is saturated, the surface of the wafer 200 is covered with the methoxy group bonded to Si, as illustrated in FIG. 5B, and a part of the surface of the wafer 200 is maintained without the consumption of the adsorption sites (OH termination). In a state in which the adsorption reaction of Si on the surface of the wafer 200 is saturated, a layer composed of Si adsorbed onto the surface of the wafer 200 becomes a discontinuous layer with a thickness of less than one atomic layer.

After the first layer is formed, the valve 243*d* is closed to stop the supply of the second precursor into the process chamber 201. Then, the interior of the process chamber 201 is vacuum-exhausted to remove any gases and substances remaining in the process chamber 201 from the interior of the process chamber 201 (purging). At this time, the valves 243*e* to 243*g* are opened to supply an inert gas into the process chamber 201. The inert gas acts as a purge gas.

[Step A]

After Step B is completed, a first precursor is supplied to the wafer 200 in the process chamber 201, that is, to the first layer formed on the wafer 200.

Specifically, the valve 243*a* is opened to allow the first precursor to flow into the gas supply pipe 232*a*. The flow rate of the first precursor is adjusted by the MFC 241*a*, and the first precursor is supplied into the process chamber 201 via the nozzle 249*a*, and is exhausted from the exhaust port 231*a*. At this time, the first precursor is supplied to the wafer 200 (first precursor supply). At this time, the valves 243*e* to 243*g* are opened to supply an inert gas into the process chamber 201 via the respective nozzles 249*a* to 249*c*. In addition, in some methods described below, it may not perform the supply of the inert gas into the process chamber 201.

As the first precursor, for example, a gas having a molecular structure containing a halogen element bonded to silicon (Si) as the predetermined element, that is, a halosilane gas may be used. Examples of the halogen element include chlorine (Cl), fluorine (F), bromine (Br), and iodine (I). As the halosilane gas, for example, a chlorosilane gas containing Si and Cl may be used.

Further, as the first precursor, for example, a chlorosilane gas such as hexachlorodisilane ($Si_2Cl_6$, abbreviation: HCDS) gas, monochlorosilane ($SiH_3Cl$, abbreviation: MCS) gas, dichlorosilane ($SiH_2Cl_2$, abbreviation: DCS) gas, trichlorosilane ($SiHCl_3$, abbreviation: TCS) gas, tetrachlorosilane ($SiCl_4$, abbreviation: STC) gas, or octachlorotrisilane ($Si_3Cl_8$, abbreviation: OCTS) gas may be used. These gases are gases not containing oxygen. One or more of these may be used as the first precursor.

As the first precursor, in addition to the chlorosilane gas, for example, a fluorosilane gas such as tetrafluorosilane ($SiF_4$) gas or difluorosilane ($SiH_2F_2$) gas, a bromosilane gas such as tetrabromosilane ($SiBr_4$) gas or dibromosilane ($SiH_2Br_2$) gas, or an iodosilane gas such as tetraiodosilane ($SiI_4$) gas or diiodosilane ($SiH_2I_2$) gas may be used. These gases are gases not containing oxygen. One or more of these may be used as the first precursor.

As the first precursor, in addition to these, for example, a gas containing Si and amino groups, that is, an aminosilane gas, may be used.

As the first precursor, for example, an aminosilane gas such as tetrakis(dimethylamino)silane ($Si[N(CH_3)_2]_4$, abbreviation: 4DMAS) gas, tris(dimethylamino)silane ($Si[N(CH_3)_2]_3H$, abbreviation: 3DMAS) gas, bis(diethylamino) silane ($Si[N(C_2H_5)_2]_2H_2$, abbreviation: BDEAS) gas, bis (tert-butylamino)silane ($SiH_2[NH(C_4H_9)]_2$, abbreviation: BTBAS) gas, or (diisopropylamino)silane ($SiH_3[N(C_3H_7)_2]$, abbreviation: DIPAS) gas may be used. These gases are gases not containing oxygen. One or more of these may be used as the first precursor.

For example, when using a HCDS gas as the first precursor, by performing this step under a processing condition described later, it is possible to detach methyl groups from a part of oxygen atoms bonded to Si by decomposing a part of methoxy groups contained in the first layer formed on the wafer 200. Further, it is possible to bond Si contained in the first precursor to the oxygen atoms, which have dangling bonds due to the detachment of methyl groups. Thereby, it is possible to form, as a second layer, a silicon (Si) containing layer which contains a halogen element such as chlorine (Cl) with a predetermined thickness on the outermost surface of the wafer 200 as a base, that is, on the first layer containing a component bonded to the alkoxy group. The Si-containing layer, which contains the halogen element, is formed on the outermost surface of the wafer 200 by, for example, physical adsorption or chemical adsorption of molecules of the first precursor, physical adsorption or chemical adsorption of molecules of a substance resulting from partial decomposition of the first precursor, or deposition of Si by thermal decomposition of the first precursor. The Si-containing layer, which contains the halogen element, may be an adsorbed layer (physical adsorption layer or chemical adsorption layer) of molecules of the first precursor or molecules of a substance resulting from partial decomposition of the first precursor, or may be a Si-containing deposition layer containing the halogen element. In cases where the above-described chemical adsorption layer or the above-described deposition layer is formed on the outermost surface of the wafer 200, Si contained in the first precursor is adsorbed onto the outermost surface of the wafer 200.

Figure 5C:
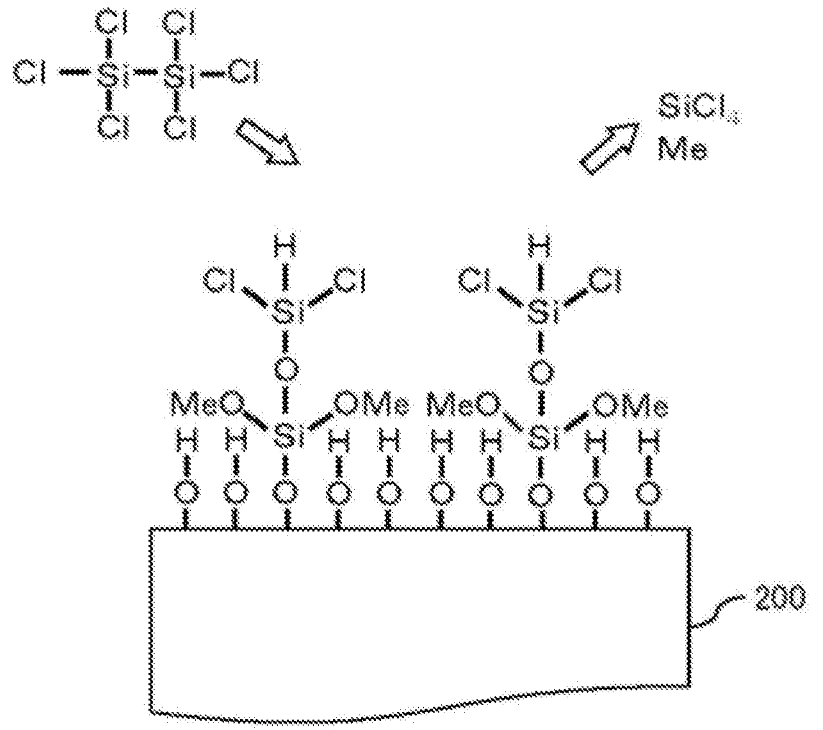
FIG. 5C is a diagram schematically illustrating a surface state of the substrate when Step A is performed after completion of Step B.

When performing this step, at least a part of alkoxy groups contained in the first layer is held (retained) without being detached from Si or without being decomposed (without detachment of alkyl groups from oxygen atoms constituting alkoxy groups). As illustrated in FIG. 5C, a layer, which is formed on the wafer 200 by performing this step (layer formed by stacking the second layer on the first layer), contains a Si—O—Si bond, and contains each of an alkoxy group (for example, a methoxy group) bonded to Si and a halogen group (for example, a chloro group) bonded to Si. In addition, a reaction product generated when forming this layer constitutes, for example, a gaseous substance containing the halosilane or amino group, and is discharged from the interior of the process chamber 201.

After the second layer is formed on the first layer, the valve 243*a* is closed to stop the supply of the first precursor into the process chamber 201. Then, by the same purging procedure as in Step B, any gases and substances remaining in the process chamber 201 are discharged from the interior of the process chamber 201 (purging).

[Step C]

After Step A is completed, an oxidizing agent is supplied to the wafer 200 in the process chamber 201, that is, to the first layer and the second layer formed on the wafer 200.

Specifically, the valve 243*b* is opened to allow the oxidizing agent to flow into the gas supply pipe 232*b*. The flow rate of the oxidizing agent is adjusted by the MFC 241*b*, and the oxidizing agent is supplied into the process chamber 201 via the nozzle 249*b*, and is exhausted from the exhaust port 231*a*. At this time, the oxidizing agent is supplied to the wafer 200 (oxidizing agent supply). At this time, the valves 243*e* to 243*g* are opened to supply an inert gas into the process chamber 201 via the respective nozzles 249*a* to 249*c*. In addition, in some methods described below, the supply of the inert gas into the process chamber 201 may not be performed.

As the oxidizing agent, for example, an oxygen (O)-containing gas such as an oxygen ($O_2$) gas, a plasma excited $O_2$ gas ($O_2$*), an ozone ($O_3$) gas, an $O_2$ gas+hydrogen ($H_2$) gas, a water vapor ($H_2O$ gas), a nitric oxide (NO) gas, or a nitrous oxide ($N_2O$) gas may be used. One or more of these may be used as the oxidizing agent.

When using the O-containing gas as the oxidizing agent, by performing this step under a processing condition described later, it is possible to oxidize (modify) at least a part of the first layer and the second layer formed on the wafer 200. For example, it is possible to detach an amino group or an alkoxy group from the first layer and bond a hydroxy group to Si contained in the first layer. Further, for example, it is possible to bond the hydroxyl group to the dangling bond of Si, which is generated by detaching hydrogen from Si contained in the second layer. Thereby, a third layer, which is obtained by oxidizing the first layer and the second layer, that is, a silicon oxide layer (SiO layer) containing Si and O, is formed on the outermost surface of the wafer 200 as the base.

Figure 5D:
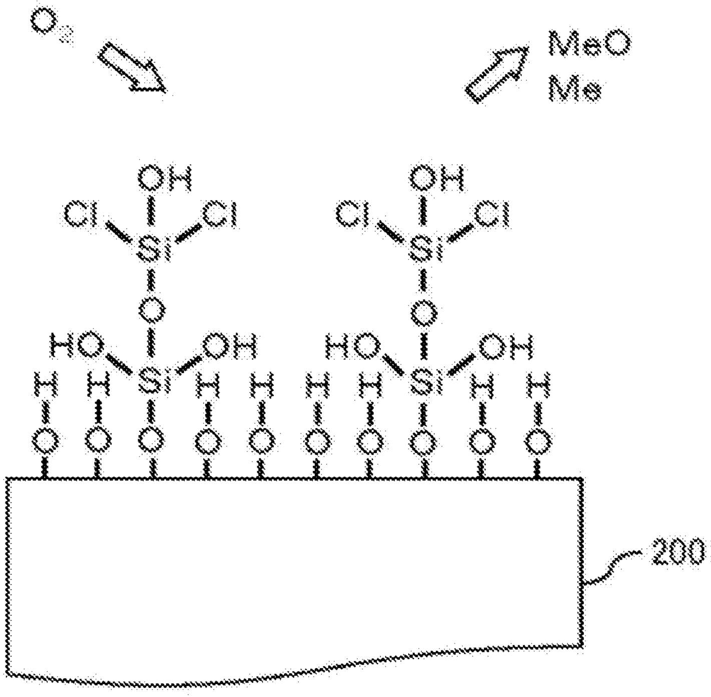
FIG. 5D is a diagram schematically illustrating a surface state of the substrate when Step C is performed after completion of Steps B and A.

In addition, when performing this step, at least a part of halogen groups contained in the second layer are held (retained) as without being detached from Si. As illustrated in FIG. 5D, a layer (third layer), which is formed on the wafer 200 by performing this step, contains a Si—O—Si bond, and contains each of a hydroxyl group (—OH) bonded to Si and a halogen group such as a chloro group bonded to Si. The halogen group functions as a reaction site with the nitriding agent supplied to the wafer 200, that is, a reaction site necessary for nitriding the third layer in Step D to be described later. In addition, a reaction product generated when forming this layer constitutes, for example, a gaseous substance containing alkoxy groups or amino groups, and is discharged from the interior of the process chamber 201.

After the SiO layer as the third layer is formed, the valve 243*b* is closed to stop the supply of the oxidizing agent into the process chamber 201. Then, by the same purging procedure as in Step B, any gases and substances remaining in the process chamber 201 are expelled from the interior of the process chamber 201 (purging).

[Step D]

After Step C is completed, a nitriding agent is supplied to the wafer 200 in the process chamber 201, that is, to the third layer formed on the wafer 200.

Specifically, the valve 243*c* is opened to allow the nitriding agent to flow into the gas supply pipe 232*c*. The flow rate of the nitriding agent is adjusted by the MFC 241*c*, and the nitriding agent is supplied into the process chamber 201 via the nozzle 249*c*, and is exhausted from the exhaust port 231*a*. At this time, the nitriding agent is supplied to the wafer 200 (nitriding agent supply). At this time, the valves

243*e* to 243*g* are opened to supply an inert gas into the process chamber 201 via the respective nozzles 249*a* to 249*c*. In addition, in some methods described below, the supply of the inert gas into the process chamber 201 may not be performed.

As the nitriding agent, for example, a hydrogen nitride-based gas such as an ammonia ($NH_3$) gas, a diazene ($N_2H_2$) gas, a hydrazine ($N_2H_4$) gas, or a $N_3H_8$ gas, that is, a gas containing nitrogen (N) and hydrogen (H) may be used. One or more of these may be used as the nitriding agent.

As the nitriding agent, for example, a gas containing nitrogen (N), carbon (C), and hydrogen (H) may be used. As the gas containing N, C, and H, for example, an amine-based gas or an organic hydrazine-based gas may be used. The gas containing N, C, and H may be a N-containing gas, a C-containing gas, an H-containing gas, or a N- and C-containing gas.

As the nitriding agent, for example, an ethylamine-based gas such as monoethylamine ($C_2H_5NH_2$, abbreviation: MEA) gas, diethylamine ($(C_2H_5)_2NH$, abbreviation: DEA) gas, or triethylamine ($(C_2H_5)_3N$, abbreviation: TEA) gas, a methylamine-based gas such as monomethylamine ($CH_3NH_2$, abbreviation: MMA) gas, dimethylamine ($(CH_3)_2NH$, abbreviation: DMA) gas, or trimethylamine ($(CH_3)_3N$, abbreviation: TMA) gas, or an organic hydrazine-based gas such as monomethylhydrazine ($(CH_3)HN_2H_2$, abbreviation: MMH) gas, dimethylhydrazine ($(CH_3)_2N_2H_2$, abbreviation: DMH) gas, or trimethylhydrazine ($(CH_3)_2N_2(CH_3)H$, abbreviation: TMH) gas may be used. One or more of these may be used as the nitriding agent.

When using the N- and H-containing gas as the nitriding agent, by performing this step under a processing condition described later, it is possible to nitride (modify) at least a part of the third layer formed on the wafer 200. For example, it is possible to detach a halogen group from the third layer by reacting the halogen group such as a chloro group contained in the third layer with the N- and H-containing gas, and to bond N-containing groups such as an amino group (—$NH_2$) obtained by decomposing the N- and H-containing gas to Si atoms, which has a dangling bond by the detachment of the halogen group. Thereby, a fourth layer, which is obtained by nitriding the third layer, that is, a silicon oxynitride layer (SiON layer) containing Si, O, and N, is formed on the outermost surface of the wafer 200 as the base.

Figure 5E:
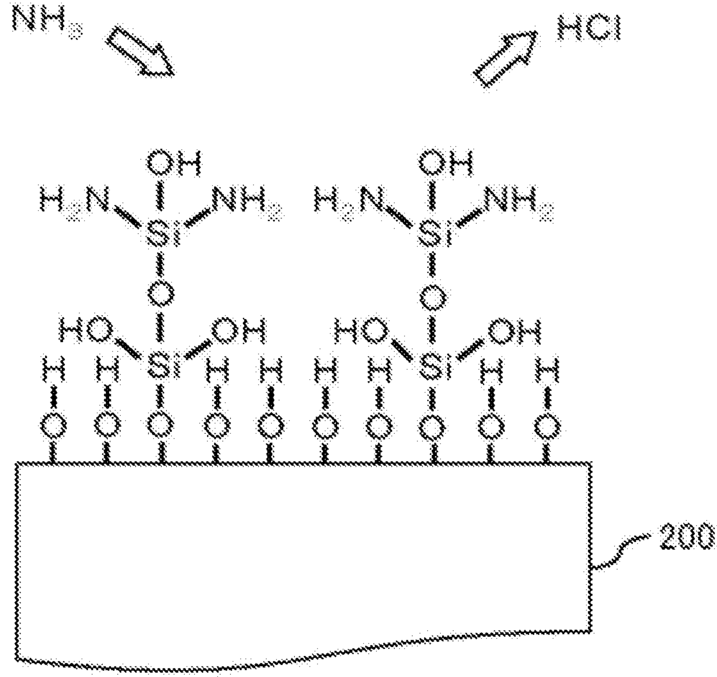
FIG. 5E is a diagram schematically illustrating a surface state of the substrate when Step D is performed after completion of Steps B, A, and C.

In addition, when performing this step, at least a part of hydroxy groups contained in the third layer are held (retained) without being detached from Si. In other words, the nitridation reaction of the third layer in this step may be realized due to the presence of halogen groups on the surface of the third layer. If the entire surface of the third layer is OH-terminated and no halogen groups are present on the surface of the third layer, it can be said that it is difficult to nitride the third layer even when performing this step. As illustrated in FIG. 5E, a layer (fourth layer), which is formed on the wafer 200 by performing this step, contains a Si—O—Si bond, and contains each of a hydroxyl group (—OH) bonded to Si and a N-containing group such as an amino group (—$NH_2$) bonded to Si. In addition, a reaction product generated when forming this layer constitutes, for example, a gaseous substance containing hydrogen halide such as HCl, and is discharged from the interior of the process chamber 201.

After the SiON layer as the fourth layer is formed, the valve 243*b* is closed to stop the supply of the nitriding agent into the process chamber 201. Then, by the same purging procedure as in Step A, any gases and substances remaining in the process chamber 201 are discharged from the interior of the process chamber 201 (purging).

[Performing Predetermined Number of Times]

It is possible to form a silicon oxynitride film (SiON film) as a film on the surface of the wafer 200 by performing a cycle a predetermined number of times (n times, n is an integer of 1 or more), the cycle including: non-simultaneously, i.e., asynchronously performing the above-described Steps B, A, C and D in this order. It is desirable that the above-described cycle is repeated multiple times. That is, the thickness of the SiON layer formed per cycle may be made thinner than a desired film thickness, and the above-described cycle may be repeated multiple times until the thickness of the SiON film formed by stacking the SiON layers has a desired film thickness. In addition, when using a gas containing N, C, and H as the nitriding agent, for example, a silicon oxycarbonitride layer (SiOCN layer) may be formed as the fourth layer, and by performing the above-described cycle a predetermined number of times, the silicon oxycarbonitride film (SiOCN film) may be formed on the surface of the wafer 200.

Hereinafter, an example of a processing condition in each step mentioned above will be described. In addition, the notation of numerical ranges such as "1 to 2666 Pa" herein imply that the lower and upper limits are included in that range. Thus, for example, "1 to 2666 Pa" means "1 Pa or more and 2666 Pa or less." The same is also applied to other numerical ranges. Further, the term "processing temperature" herein refers to the temperature of the wafer 200, and the term "processing pressure" refers to the internal pressure of the process chamber 201, which is a space in which the wafer 200 is present. Further, "gas supply flow rate: 0 slm" indicates a case where the gas is not supplied. These are also the same in the following descriptions.

An example of a processing condition in Step B is described as follows.

Second precursor supply flow rate: 0.01 to 2 slm, particularly 0.1 to 1 slm

Second precursor supply time: 1 to 120 seconds, particularly 1 to 60 seconds

Inert gas supply flow rate: 0 to 30 slm

Processing temperature: 550 to 700 degrees C., particularly 600 to 650 degrees C.; and Processing pressure: 1 to 2,666 Pa, particularly 67 to 1,333 Pa.

An example of a processing condition in Step A is described as follows.

First precursor supply flow rate: 0.01 to 2 slm, particularly 0.1 to 1 slm

First precursor supply time: 1 to 120 seconds, particularly 1 to 60 seconds

Other processing conditions may be the same as the processing conditions in Step B An example of a processing condition in Step C is described as follows.

Oxidizing agent supply flow rate: 0.1 to 10 slm

Oxidizing agent supply time: 1 to 120 seconds, particularly 1 to 60 seconds

Processing pressure: 1 to 4,000 Pa, particularly 1 to 3,000 Pa

Other processing conditions may be the same as the processing conditions in Step B.

An example of a processing condition in Step D is described as follows.

Nitriding agent supply flow rate: 0.1 to 10 slm;

Nitriding agent supply time: 1 to 120 seconds, particularly 1 to 60 seconds; and Processing pressure: 1 to 4,000 Pa, particularly 1 to 3,000 Pa.

Other processing conditions may be the same as the processing conditions in Step B.

In addition, by adjusting the ratio of the supply time of the second precursor in Step B to the supply time of the first precursor in Step A, it is possible to set the concentration of nitrogen contained in the SiON film formed on the wafer 200 to a desired value.

For example, by increasing the ratio of the supply time of the second precursor in Step B to the supply time of the first precursor in Step A, it is possible to lower the concentration of nitrogen contained in the SiON film formed on the wafer 200.

Further, for example, by decreasing the supply time of the first precursor in Step A as compared with the supply time of the second precursor in Step B, it is possible to lower the concentration of nitrogen contained in the SiON film formed on the wafer 200.

Further, by adjusting the ratio of the processing pressure in Step B to the processing pressure in Step A, it is possible to set the concentration of nitrogen contained in the SiON film formed on the wafer 200 to a desired value.

For example, by increasing the ratio of the processing pressure in Step B to the processing pressure in Step A, it is possible to lower the concentration of nitrogen contained in the SiON film formed on the wafer 200.

Further, for example, by decreasing the processing pressure in Step A as compared with the processing pressure in Step B, it is possible to lower the concentration of nitrogen contained in the SiON film formed on the wafer 200.

In addition, by adjusting the ratio of the supply flow rate of the second precursor in Step B to the supply flow rate of the second precursor in Step A, it is possible to set the concentration of nitrogen contained in the SiON film formed on the wafer 200 to a desired value.

For example, by increasing the ratio of the supply flow rate of the second precursor in Step B to the supply flow rate of the first precursor in Step A, it is possible to lower the concentration of nitrogen contained in the SiON film formed on the wafer 200.

Further, for example, by decreasing the supply flow rate of the first precursor in Step A as compared with the supply flow rate of the second precursor in Step B, it is possible to lower the concentration of nitrogen contained in the SiON film formed on the wafer 200.

(After-Purging and Atmospheric Pressure Restoration)

After the formation of the film having a desired thickness on the wafer 200 is completed, an inert gas as a purge gas is supplied into the process chamber 201 from the respective nozzles **249*a* to 249*c*, and is exhausted from the exhaust port 231*a*. Thus, the interior of the process chamber 201 is purged, and any gases and reaction by-products remaining in the process chamber 201 are removed from the interior of the process chamber 201 (after-purging). Thereafter, the atmosphere in the process chamber 201 is replaced with the inert gas (inert gas replacement), and the internal pressure of the process chamber 201** is returned to normal pressure (atmospheric pressure restoration).

(Boat Unloading and Wafer Discharging)

After that, the seal cap 219 is lowered by the boat elevator 115 to open the lower end of the manifold 209. Then, the processed wafer 200 supported by the boat 217 is unloaded from the lower end of the manifold 209 to the outside of the reaction tube 203 (boat unloading). After the boat unloading, the shutter **219*s* is moved, and the lower end opening of the manifold 209 is sealed by the shutter 219*s* via the O-ring 220*c* interposed therebetween (shutter closing). The processed wafer 200 is unloaded to the outside of the reaction tube 203, and thereafter, is discharged out from the boat 217** (wafer discharging).

(3) Effects of the Present Embodiment

According to the present embodiments, one or a plurality of effects described below are acquired.

(a) By performing a cycle a predetermined number of times, the cycle including performing the above-described Steps B, A, C, and D in this order, it is possible to control the concentration (compositional ratio) of nitrogen in a SiON film formed on the wafer 200 to have a desired value, for example, to lower the nitrogen concentration to a desired value.

In addition, in case of performing a cycle a predetermined number of times, the cycle including performing the above-described Steps B, C and D in this order without performing Step A, it becomes difficult to proceed the nitridation reaction, so that it difficult to incorporate nitrogen into the film formed on the wafer 200 and thus the silicon oxide film (SiO film), which hardly contains nitrogen, is formed on the wafer 200. It is considered that this is because it is difficult for the bonding hands of Si atoms in the Si-containing layer formed on the wafer 200 by performing Step B to be bonded with nitrogen, which is contained in the N- and H-containing gas as the nitriding agent. As in the present embodiment, since it is possible to allow the halogen groups, which can be still reacted with the N- and H-containing gas even after the oxidizing agent is supplied, to present on the surface of the Si-containing layer formed on the wafer 200. As a result, it is possible to incorporate nitrogen into a layer formed on the wafer 200 and to form a SiON film with a desired concentration of nitrogen on the wafer 200.

Further, in case of performing a cycle a predetermined number of times, the cycle including performing the above-described Steps A, C, and D in this order without performing Step B, an excessive amount of nitrogen may be incorporated into the film formed on the wafer 200, which makes it difficult to reduce the concentration of nitrogen in the SiON film formed on the wafer 200 to a desired value. It is considered that this is because a Si-containing layer formed through Step A has high reactivity with the N- and H-containing gas, so that it is difficult to suppress nitrogen from being added to the Si-containing layer formed on the wafer 200 even if the processing condition in Steps C and D is widely changed. As in the present embodiment, by performing Step B in advance before Step A, it is possible to lower the concentration of nitrogen in the SiON film formed on the wafer 200 to a desired value by appropriately suppressing nitrogen from being added to the Si-containing layer formed on the wafer 200.

(b) In Step B, by continuing the supply of the second precursor until the adsorption reaction (chemisorption) of Si of the second precursor on the surface of the wafer 200 is saturated, it is possible to maximize the proportion of Si or oxygen contained in the first layer and lower the concentration of nitrogen in the SiON film formed on the wafer 200.

(c) In Step B, by detaching an amino group from Si contained in the second precursor without detaching an alkoxy group, and adsorbing Si, where the amino group is detached while maintaining the bonding with the alkoxy group, onto the surface of the wafer 200, it is possible to inhibit the adsorption of an atom or a molecule onto Si adsorbed onto the surface of the wafer 200 and onto the adsorption site on the surface of the wafer 200 that is located in a vicinity of Si due to the action of the alkoxy groups bonded to Si. As a result, it is possible to make a layer composed of Si adsorbed onto the surface of the wafer 200 to a discontinuous layer with a thickness of less than one atomic layer. Thus, then, it is possible to improve the wafer in-plane film thickness uniformity and step coverage of the SiON film formed on the wafer 200, so that it possible to make the film as a conformal SiON film. In addition, when a gas in which an amino group is bonded to a central Si atom and an alkoxy group is not bonded, such as, for example, a 3DMAS gas as the precursor gas, the action of the alkoxy group (methoxy group) in the present embodiment may not be obtained, so that there may be case that the wafer in-plane film thickness uniformity of step coverage of the SiON film formed on the wafer 200 is lowered.

(d) In Step B, by suppressing the amino group, which is detached from Si contained in the second precursor, from being adsorbed onto the surface of the wafer 200, it is possible to make a Si-containing layer on the wafer 200 to a layer with less impurities such as C. This makes it possible to make a SiON film to be formed on the wafer 200 into a film that exhibits excellent processing durability.

(e) In Steps C and D, by detaching an amino group, a methoxy group, and a halogen group from a modifying target layer, it is possible to make a modified layer to a layer with less impurities such as carbon and halogen elements. This makes it possible to make a SiON film to be formed on the wafer 200 to a film that exhibits excellent processing durability.

(f) In Steps C and D, by supplying the oxidizing agent and the nitriding agent in a non-plasma atmosphere, it is possible to avoid plasma damage to the film formed on the wafer 200 or the base thereof, as well as members within the process chamber 201.

(g) The above-described effects may be similarly acquired even when using the above-described various precursors, the above-described various oxidizing agents, the above-described various nitriding agents, and the above-described various inert gases.

(4) Modifications

A substrate processing sequence in the present embodiment may be modified as in the following modifications. These modifications may be combined arbitrarily. Unless otherwise specified, the processing procedures and processing conditions for each step in each modification may be the same as the processing procedures and processing conditions in each step of the above-described embodiment.

(Modification 1)

In each cycle, Steps A, B, C, and D may be performed in this order as in the following gas supply sequence.

(First Precursor→Second Precursor→Oxidizing agent→Nitriding agent)×n

Also in this modification, the same effects as in the above-described embodiment are acquired. Further, in this modification, a first layer having a halogen termination is formed on the wafer 200 by supplying the first precursor in advance. Since it is difficult in the first layer having the halogen termination to cause a substitution reaction with amino groups contained in the second precursor, the proportion of the first layer having the halogen termination, which is more reactive with the N- and H-containing gas as the nitriding agent, is relatively higher as compared with the proportion of a second layer formed of the second precursor. Thus, it becomes easier to increase the nitrogen concentration in the SiON film formed on the wafer 200 as compared with the above-described embodiment.

(Modification 2)

In each cycle, Steps A, B, D and C may be performed in this order as in the following gas supply sequence.

(First Precursor→Second Precursor→Nitriding agent→Oxidizing agent)×n

Also in this modification, the same effects as in the above-described embodiment are acquired. Further, in this modification, since a reaction between the N- and H-containing gas and the first and second layers in Step D is more likely to occur as compared with the above-described embodiment, it becomes easier to adjust the nitrogen concentration in the SiON film formed on the wafer 200 to be relatively higher as compared with a case where the oxidizing agent is supplied in Step C before Step D as in the above-described embodiment. In other words, in order to adjust the nitrogen concentration in the SiON film formed on the wafer 200 to be lower, it is more suitable to supply the oxidizing agent to the wafer 200 in Step C before Step D as in the above-described embodiment or Modification 1. Further, in this modification, it is possible to increase the formation rate of the SiON film on the wafer 200 as compared with the above-described embodiment or Modification 1.

(Modification 3)

In each cycle, Steps B, A, D and C may be performed in this order as in the following gas supply sequence.

(Second Precursor→First Precursor→Nitriding agent→Oxidizing agent)×n

Also in this modification, the same effects as in the above-described embodiment are acquired. Further, in this modification, similarly to Modification 2, it becomes easier to adjust the nitrogen concentration in the SiON film formed on the wafer 200 to be relatively higher as compared with the above-described embodiment or Modification 1. Further, in this modification, similarly to Modification 2, it is possible to increase the formation rate of the SiON film on the wafer 200 as compared with the above-described embodiment or Modification 1.

(Modification 4)

It is also possible to supply (pre-flow) the nitriding agent to the wafer 20 before performing the cycle a predetermined number of cycles, as in the following gas supply sequence.

Nitriding agent→(Second Precursor→First Precursor→Oxidizing agent→Nitriding agent)×n Nitriding agent→(First Precursor→Second Precursor→Oxidizing agent→Nitriding agent)×n Nitriding agent→(Second Precursor→First Precursor→Nitriding agent→Oxidizing agent)×n Nitriding agent→(First Precursor→Second Precursor→Nitriding agent→Oxidizing agent)×n Also in this modification, the same effects as in the above-described embodiment are acquired. Further, in this modification, by pre-flowing the N- and H-containing gas as the nitriding agent, it is possible to form H termination (NH termination) that becomes adsorption sites on the surface of the wafer 200 before performing the cycle and to make the surface of the wafer 200 to a state easy to react with the first precursor or the second precursor in Step A or Step B. This promotes the formation of the Si-containing layer on the wafer 200 after the cycle is initiated, so that it is possible to reduce the incubation time when forming the SiON film on the wafer 200.

In addition, the supply conditions for the nitriding agent during the pre-flow and in Step D may be different. Further, the nitriding agent used during the pre-flow and in Step D may be either the same type of gas or different types of gases.

(Modification 5)

In each cycle, it may overlap the supply period of the first precursor in Step A with at least a part of the supply period of the second precursor in Step B. Also in this modification, the same effects as in the above-described embodiment are acquired. Furthermore, in this modification, it is possible to shorten the cycle time and improve the throughput of the film-forming process.

(Modification 6)

In Step B, it may stop the supply of the second precursor before the adsorption reaction on the surface of the wafer 200 is saturated. By adjusting the supply time of the second precursor in the unsaturated state where the adsorption reaction of the second precursor is not saturated, it is possible to adjust the proportion of silicon or oxygen contained in the Si-containing layer formed in Step B, thereby controlling the nitrogen concentration in the SiON film formed on the wafer 200.

For example, by shortening the supply time of the second precursor in Step B in the unsaturated state of the adsorption reaction of the second precursor, it is possible to adjust the nitrogen concentration in the SiON film formed on the wafer 200 to a higher level.

Other Embodiments of the Present Disclosure

The embodiment of the present disclosure has been specifically described above. However, the present disclosure is not limited to the above-described embodiment, and may be changed in various ways without departing from the gist of the present disclosure.

An oxidizing agent or a nitriding agent may be supplied by plasma excitation. The processing procedures and processing conditions in this case may be the same as those in Steps C and D of the above-described embodiment. Even in such a case, the same effect as in the above-described embodiment may be acquired.

A predetermined element constituting a central atom X contained in a precursor may be, for example, a metal element such as aluminum (Al), titanium (Ti), zirconium (Zr), hafnium (Hf), or lanthanum (La). Further, the predetermined element may be, for example, an element from the same Group 14 as Si or even a Group 4 element. When the predetermined element is a Group 14 element or Group 4 element, the second precursor may have a molecular structure in which one of bonding hands of a predetermined element atom is bonded to an amino group and the remaining three bonding hands are bonded to an alkoxy group. Further, when using the precursor containing these metal elements as the predetermined element, it is possible to form metal oxynitride films such as aluminum oxynitride (AlON) film, titanium oxynitride (TiON) film, zirconium oxynitride (ZrON) film, hafnium oxynitride (HfON) film, and lanthanum oxynitride (LaON) film on the wafer. The processing procedures and processing conditions in this case may be the same as those in the above-described embodiment. Even in such a case, the same effect as in the above-mentioned embodiment may be acquired.

It may be desirable that recipes used for each process are separately prepared according to the processing contents and are stored in the memory 121*c* via a telecommunication network or the external memory 123. Then, when starting each process, the CPU 121*a* may appropriately select a suitable recipe from among a plurality of recipes stored in the memory 121*c* according to the contents of the process. This makes it possible to form films of various film types, composition ratios, film qualities, and film thicknesses with high reproducibility in one substrate processing apparatus. In addition, the burden on an operator can be reduced, and each process can be quickly started while avoiding operation errors.

The above-described recipes are not limited to the newly-prepared ones, but may be prepared by, for example, changing the existing recipes already installed in the substrate processing apparatus. In the case of changing the recipes, the changed recipes may be installed in the substrate processing apparatus via an electric communication line or a recording medium in which the recipes are recorded. In addition, the input/output device 122 included in the existing substrate processing apparatus may be operated to directly change the existing recipes already installed in the substrate processing apparatus.

In the above-described embodiment, there has been described an example in which a film is formed by using a batch type substrate processing apparatus for processing a plurality of substrates at a time. The present disclosure is not limited to the above-described embodiments, but may be suitably applied to, for example, a case where a film is formed by using a single-wafer type substrate processing apparatus for processing one or several substrates at a time. Furthermore, in the above-described embodiment, there has been described an example in which a film is formed by using a substrate processing apparatus including a hot wall type process furnace. The present disclosure is not limited to the above-described embodiment, but may also be suitably applied to a case where a film is formed by using a substrate processing apparatus including a cold wall type process furnace.

Even in the case of using these substrate processing apparatuses, each process may be performed under the same processing procedures and processing conditions as those in the above-described embodiment and modifications, and the same effects as those of the above-described embodiments and modifications may be obtained.

In addition, the above-described embodiments and modifications may be used in combination as appropriate. The processing procedures and processing conditions at this time may be the same as, for example, the processing procedures and processing conditions of the above-described embodiment and modifications.

EXAMPLES

FIG. 6 is a diagram illustrating various measured results of a film formed on the substrate. As Sample 1, the above-described substrate processing apparatus was used to form a SiON film on a wafer by performing, a predetermined number of times, a cycle in which a TMDMAS gas as the second precursor, a HCDS gas as the first precursor, an $O_2$ gas as the oxidizing agent, and a $NH_3$ gas as the nitriding agent were sequentially supplied to the wafer. The processing condition for each step was set to a predetermined condition within the range of the processing condition described in the above-described embodiments.

As Sample 2, the above-described substrate processing apparatus was used to form a SiON film on a wafer by performing, a predetermined number of times, a cycle in which the first precursor, the second precursor, the oxidizing agent, and the nitriding agent were supplied in this order to the wafer. The processing condition for each step and the number of cycles performed were set to be the same as those in the preparation of Sample 1.

As Sample 3, the above-described substrate processing apparatus was used to form a SiON film on a wafer by performing, a predetermined number of times, a cycle in which the first precursor, the oxidizing agent, and the nitriding agent were supplied in this order to the wafer. The processing condition for each step and the number of cycles performed were set to be the same as those in the preparation of Sample 1.

Then, the wafer in-plane average film thickness (Thick.), refractive index (R.I.), and nitrogen concentration (N concentration) were measured for the SiON film of each sample. In addition, the refractive index is used as an indicator of the Si concentration in the SiON film, with higher refractive index values indicating higher Si concentrations. As a result, it could be observed that the SiON films of Sample 1 and Sample 2, which were prepared using both the first and second precursors, had lower nitrogen concentrations as compared with the SiON film of Sample 3, which was prepared using only the first precursor without using the second precursor. Further, it could be observed that the SiON film of Sample 1, prepared by supplying the second precursor, the first precursor, the oxidizing agent, and the nitriding agent in this order, had a lower N concentration than the SiON film of Sample 2, prepared by supplying the first precursor, the second precursor, the oxidizing agent, and the nitriding agent in this order.

According to the present disclosure, it is possible to provide a technique capable of enhancing the controllability of the composition ratio of a film containing a predetermined element, oxygen, and nitrogen, which is formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:

forming a film containing a predetermined element, oxygen, and nitrogen on the substrate by performing a cycle a predetermined number of times, the cycle including:

(a) supplying a first precursor containing the predetermined element to the substrate;

(b) supplying a second precursor having a molecular structure different from a molecular structure of the first precursor and containing an alkoxy group bonded to an atom of the predetermined element to the substrate;

(c) supplying an oxidizing agent to the substrate; and (d) supplying a nitriding agent to the substrate, wherein in (b), the second precursor is supplied to the substrate under a condition in which the alkoxy group is not detached from the atom of the predetermined element and at least one other group bonded to the atom of the predetermined element is detached and under a condition in which the atom of the predetermined element, where the at least one other group is detached and the bonding with the alkoxy group is maintained, is adsorbed onto a surface of the substrate.

2. The method of claim 1, wherein (a), (b), (c), and (d) are non-simultaneously performed in the cycle.

3. The method of claim 2, wherein (a), (b), (c), and (d) are performed in this order in the cycle.

4. The method of claim 2, wherein (b), (a), (c) and (d) are performed in this order in the cycle.

5. The method of claim 2, wherein (a), (b), (d) and (c) are performed in this order in the cycle.

6. The method of claim 2, wherein (b), (a), (d) and (c) are performed in this order in the cycle.

7. The method of claim 1, further comprising supplying the nitriding agent to the substrate before performing the cycle the predetermined number of times.

8. The method of claim 1, wherein the second precursor has a molecular structure in which an amino group is bonded to at least one bonding hand of the atom of the predetermined element and the alkoxy group is bonded to a remaining bonding hand of the atom of the predetermined element.

9. The method of claim 1, wherein the predetermined element is silicon.

10. The method of claim 1, wherein the first precursor has a molecular structure containing a halogen element bonded to an atom of the predetermined element.

11. The method of claim 1, wherein a ratio of a supply time of the second precursor in (b) to a supply time of the first precursor in (a) is set such that a concentration of nitrogen contained in the film becomes a predetermined value.

12. The method of claim 1, wherein a ratio of a pressure in a space in which the substrate is present in (b) to a pressure of a space in which the substrate is present in (a) is set such that a concentration of nitrogen contained in the film becomes a predetermined value.

13. The method of claim 1, wherein a ratio of a supply flow rate of the second precursor in (b) to a supply flow rate of the first precursor in (a) is set such that a concentration of nitrogen contained in the film becomes a predetermined value.

14. The method of claim 1, wherein in (b), the supply of the second precursor is continued until an adsorption reaction of the second precursor onto the surface of the substrate is saturated.

15. The method of claim 1, wherein in (b), the supply of the second precursor is stopped before an adsorption reaction of the second precursor onto the surface of the substrate is saturated.

16. A method of manufacturing a semiconductor device, comprising the method of claim 1.

17. A substrate processing apparatus comprising:

a first precursor supply system configured to supply a first precursor containing a predetermined element to a substrate;

a second precursor supply system configured to supply a second precursor having a molecular structure different from a molecular structure of the first precursor and containing an alkoxy group bonded to an atom of the predetermined element to the substrate;

an oxidizing agent supply system configured to supply an oxidizing agent to the substrate;

a nitriding agent supply system configured to supply a nitriding agent to the substrate; and a controller configured to be capable of controlling the first precursor supply system, the second precursor supply system, the oxidizing agent supply system, and the nitriding agent supply system, so as to perform forming a film containing the predetermined element, oxygen, and nitrogen on the substrate by performing a cycle a predetermined number of times, the cycle including:

(a) supplying the first precursor to the substrate;

(b) supplying the second precursor to the substrate;

(c) supplying the oxidizing agent to the substrate; and (d) supplying the nitriding agent to the substrate, wherein in (b), the second precursor is supplied to the substrate under a condition in which the alkoxy group is not detached from the atom of the predetermined element and at least one other group bonded to the atom of the predetermined element is detached and under a condition in which the atom of the predetermined element, where the at least one other group is detached and the bonding with the alkoxy group is maintained, is adsorbed onto a surface of the substrate.

18. A non-transitory computer readable recording medium storing a program that causes, by a computer, a substrate processing apparatus to perform forming a film containing a predetermined element, oxygen, and nitrogen on a substrate by performing a cycle a predetermined number of times, the cycle including:

(a) supplying a first precursor containing the predetermined element to the substrate;

(b) supplying a second precursor having a molecular structure different from a molecular of the first precursor and containing an alkoxy group bonded to an atom of the predetermined element to the substrate;

(c) supplying an oxidizing agent to the substrate; and (d) supplying a nitriding agent to the substrate, wherein in (b), the second precursor is supplied to the substrate under a condition in which the alkoxy group is not detached from the atom of the predetermined element and at least one other group bonded to the atom of the predetermined element is detached and under a condition in which the atom of the predetermined element, where the at least one other group is detached and the bonding with the alkoxy group is maintained, is adsorbed onto a surface of the substrate.

* * * * *